(12) United States Patent
Gill et al.

(10) Patent No.: US 8,270,779 B2
(45) Date of Patent: Sep. 18, 2012

(54) MULTITHICKNESS LAYERED ELECTRONIC-PHOTONIC DEVICES

(75) Inventors: Douglas M. Gill, South Orange, NJ (US); Mahmoud Rasras, Berkeley Heights, NJ (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/230,962

(22) Filed: Sep. 13, 2011

(65) Prior Publication Data

US 2012/0003763 A1    Jan. 5, 2012

Related U.S. Application Data

(62) Division of application No. 12/270,253, filed on Nov. 13, 2008, now Pat. No. 8,041,158.

(51) Int. Cl.
*G02F 1/035*    (2006.01)
*G02B 6/42*    (2006.01)

(52) U.S. Cl. .............................. 385/2; 385/40

(58) Field of Classification Search ................. None
See application file for complete search history.

(56) References Cited

U.S. PATENT DOCUMENTS

| | | | |
|---|---|---|---|
| 6,767,801 B2 | 7/2004 | Kawamura et al. |
| 2003/0036289 A1 | 2/2003 | Kawamura et al. |
| 2004/0028312 A1 | 2/2004 | Park et al. |
| 2006/0210215 A1 | 9/2006 | Aoki et al. |
| 2008/0159680 A1 | 7/2008 | Gill |
| 2008/0212913 A1 | 9/2008 | Gill et al. |
| 2010/0119190 A1 | 5/2010 | Gill et al. |

FOREIGN PATENT DOCUMENTS

WO    01 67510 A1    9/2001

*Primary Examiner* — Jerry Rahill
(74) *Attorney, Agent, or Firm* — Hitt Gaines, PC

(57) ABSTRACT

An apparatus comprising an electronic-photonic device. The device includes a planar substrate having a top layer on a middle layer, active electronic components and active photonic waveguide components. The active electronic components are located on first lateral regions of the top layer, and the active photonic waveguide components are located on second lateral regions of the top layer. The second-region thickness is greater than the first-region thickness. The top layer has a higher refractive index than the middle layer.

12 Claims, 11 Drawing Sheets

MULTITHICKNESS LAYERED ELECTRONIC-PHOTONIC DEVICES

CROSS REFERENCE TO RELATED APPLICATION

This Application is a Divisional of U.S. application Ser. No. 12/270,253 now U.S. Pat. No. 8,041,158, filed on Nov. 13, 2008 to Douglas M. Gill, et al., entitled "MULTITHICKNESS LAYERED ELECTRONIC-PHOTONIC DEVICES," currently allowed; commonly assigned with the present invention and incorporated herein by reference.

TECHNICAL FIELD OF THE INVENTION

The present invention is directed, in general, to mixed electronic and optical devices and, more specifically, to mixed electronic-photonic devices and methods for manufacturing the same.

BACKGROUND OF THE INVENTION

There is great interest in the use of mixed electronic photonic devices in telecommunication and computational applications. An electronic-photonic integrated circuit device has photonic waveguide components, i.e., planar optical devices including optical waveguides, and active electronic components, i.e., electrical circuits including active electronic devices such as transistors, that are on the same substrate and that interact with each other to perform the device's function. To optimize the overall performance of a mixed electronic photonic device, it is important to optimize the performance of the individual electronic and photonic waveguide components that make up the device.

SUMMARY OF THE INVENTION

One embodiment of the present disclosure includes an apparatus that comprises an electronic-photonic device. The device includes a planar substrate, electronic components and photonic components. The substrate has a top layer on a middle layer, and the top layer has a higher refractive index than the middle layer. The electronic components are located on first regions of the top layer, and the photonic components are located on second regions of the top layer. The second-region thickness is greater than the first-region thickness of the top layer.

Another embodiment is a method of manufacturing the apparatus, which comprises fabricating the electronic-photonic device. Fabricating the electronic-photonic device includes providing the above-described planar substrate and forming first regions and second regions from the top layer. The first regions are formed such that a first-region region thickness of the first regions is less than a second region-thickness of said second region. Fabricating the electronic-photonic device further includes forming electronic components on the first regions, and, forming photonic components on the second regions.

BRIEF DESCRIPTION OF THE DRAWINGS

The various embodiments can be understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

The present disclosure benefits from the recognition that electronic devices and photonic devices perform optimally when they are formed on different thicknesses of a substrate layer. That is, the performance of the electronic components and photonic waveguide components can be improved by making local adjustments to the thickness of the one substrate layer that these respective components are formed on.

A number of example embodiments are presented below in the context of making thickness adjustments to a silicon layer of a silicon-on-insulator (SOI) substrate in electronic-photonic devices. One skilled in the art, however, would appreciate how the disclosure could also be applied to other types of substrates where multi-thickness layers could improve the performance of individual device components. For example, the performance of an electronic-photonic device manufactured on doped InP substrate layers could be similarly improved by adjusting the thickness of the doped InP layer by processes similar to that disclosed herein.

Figure 1:
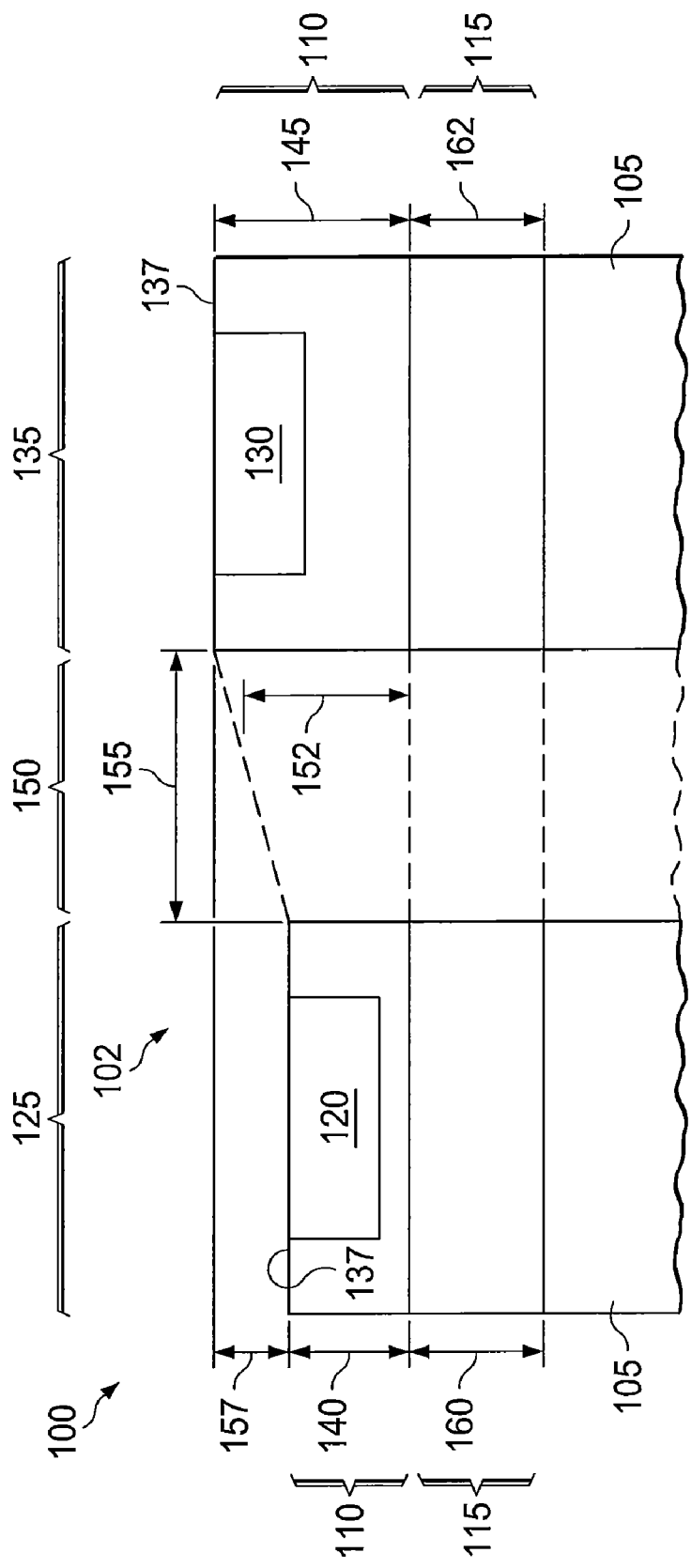
FIG. 1 shows an example embodiment of an apparatus of the disclosure that comprises an electronic-photonic device.

FIG. 1 shows an example embodiment of the disclosure, an apparatus 100 that comprises an electronic-photonic device 102. The electronic-photonic device 102 can be part of a larger apparatus 100 (other components not show), or in some cases, the device 102 can be the entire apparatus. The electronic-photonic device 102 includes a planar substrate 105 having a top layer 110 on a middle layer 115. The device 102 also includes active electronic components 120 located on first lateral regions 125 of the top layer 110, and, photonic waveguide components 130 located on or in second lateral regions 135 of the top layer 110 (e.g., the regions 125, 135 are lateral along the outer surface 137 of the top layer 110). FIG. 1 shows target locations of a generic active electronic components 120 and photonic waveguide components 130 before their formation from the top layer. The top layer 110 in first lateral regions 125 have a first-region thickness 140, while the top layer 110 in the second lateral regions 135 have a second lateral region thickness 145. The second-region thickness 145 is greater than the first-region thickness 140. The top layer 110 has a higher refractive index than the middle layer 115.

It is beneficial for the top layer 110 to have a higher refractive index than the middle layer 115 to facilitate the top layer 110 having light guiding properties in the photonic waveguide components 130. For instance, when top layer 110 has a higher refractive index than the middle layer 115, the middle layer 115 more effectively helps to retain light in the top layer 110. In some cases, at least a portion of the top layer 110 can be the core of a photonic waveguide component 130 and at least a portion of the middle layer 115 can be part of a waveguide cladding surrounding the core.

To facilitate the coupling between specific electronic and photonic waveguide components 120, 130, there can be plurality of first lateral regions 125 and second lateral regions 135 that are intermingled with each other on the substrate 105. For example, in some cases it is desirable to have drive active electronic components 120 that are close to electro-optic modulator photonic waveguide components 130. In some cases, the second-region thickness 145 can have a plurality of different thicknesses because different types of photonic waveguide components may function optimally at different thicknesses.

For optimal performance of both electronic and photonic waveguide components 120, 130 the second-region thickness 145 may be substantially greater than the first-region thickness 140. The active electronic components 120 can have optimal performance, such as measured by switching speed, when they are, for example, formed on first lateral regions 125 having a smaller thickness 140 of the top silicon layer 105. The photonic waveguide components 130 can have optimal performance, such as measured by light confinement or minimal power consumption, when they are formed on second lateral regions 135 having a larger thickness 145 of the silicon layer 105. For instance, a thicker top silicon layer 110 can facilitate light containment within the light guiding portions of the photonic waveguide components 130. For instance, power consumption of a photonic waveguide component 130 is less because the overlap between the optical mode and the medium used to modify the properties of the optical mode can be optimized.

Consider, for example, a thermo-optic device. It may be desirable to optimize the confinement of the light in the core of the optical waveguide when the waveguide core material (e.g., silicon) is more thermally sensitive than the cladding material (e.g., silicon oxide) used for the device. Optimizing the confinement of the light will reduce the power consumption (or size) of the thermo-optic device. For thermo-optical filter applications, however, it may be desirable to minimize optical loss. Therefore, the waveguide geometry preferably has a more rectangular cross section because the etched sidewalls of the waveguide tend to induce loss whereas the surface of the top silicon layer 110 is atomically smooth and induces little loss.

Alternately, for a plasma dispersion device it may be desirable to maximize the overlap of the modulated carriers and the optical mode, and, to minimize the transit time of carriers in the device. Therefore, a waveguide geometry that is more square and less rectangular cross section may be desirable in order to maximize overlap and minimize carrier transit time. Nevertheless, changing the width of the optical waveguide will change the required film thickness for optimal optical confinement. Therefore, different thicknesses may be used for different optical functions.

In some embodiments, for example, the first-region thickness 140 may be less than about 0.1 micron while the second-region thicknesses 145 equals about 0.2 microns or greater. In some embodiments, the first-region thickness 140 is in a range of about 0.05 to 0.15 microns and the second-region thickness is in a range of about 0.15 to 0.35 microns.

Figure 2:
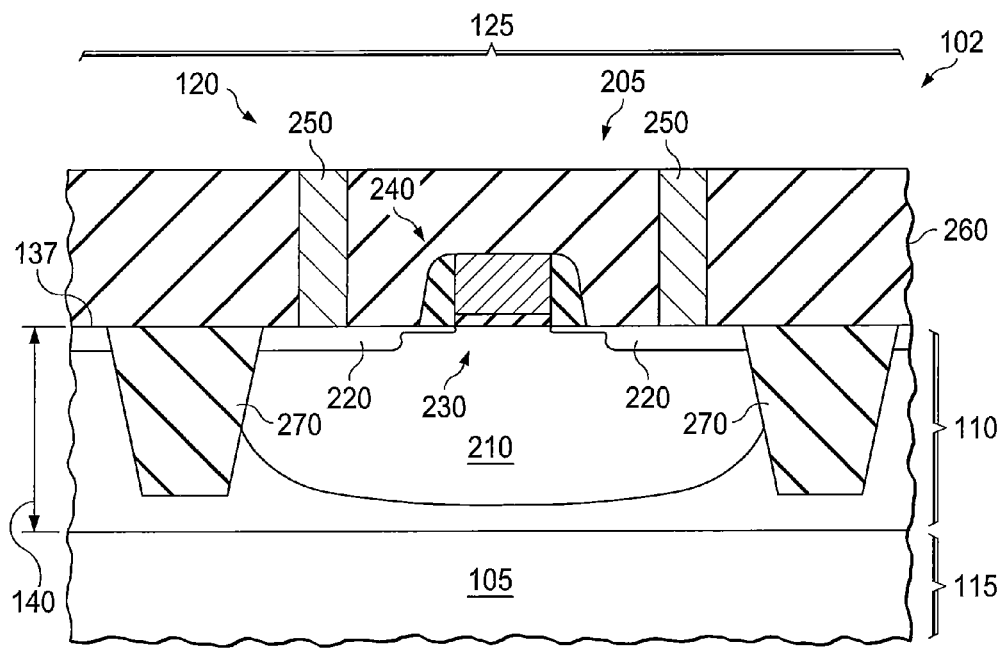
FIG. 2 shows a cross-sectional view of a first region lateral of an example electronic-photonic device, such as the device of FIG. 1.

FIG. 2 shows a cross-sectional view of an example portion of the first lateral region 125 of the electronic-photonic device 102. In this example, the active electronic components 120 can include electronic integrated circuits (ICs) that include metal-on-oxide (MOS) transistors 205 formed on a SOI substrate 105. The top layer 110 includes, or is, a silicon layer, and, the middle layer 115 includes, or is, a silicon oxide layer. In some embodiments, the top silicon layer 110 is preferably a crystalline silicon layer because this facilitates the optimal performance of the electronic or photonic waveguide components 120, 130 or both. Active electronic components 120 configured as MOS transistors can have doped wells 210, source and drain structures 220 and channel regions 230, all of which can be formed from the silicon layer 110. A gate structure 240, interconnect structures 250, insulating layers 260 and insulating isolation structures 270 can be located on or in the silicon layer 105 to complete the transistor's structure 205.

The electronic ICs 120 can have optimal performance, as measured by transistor 205 switching speeds, when formed on a top layer 110 of a relatively smaller thickness 140 than the top layer thickness 145 in the second lateral region 135. A MOS transistor 205 formed on first lateral regions 125 having a smaller thickness 140 of silicon has a faster switching speed because the overall capacitance of a transistor junction is reduced. Also, the carriers are confined more closely to the surface of the silicon and so thinner gate oxides can be used. Furthermore, in the manufacture of electronic ICs 120 certain processing protocols are often developed based on the given thickness of a silicon top layer. If the thickness of the silicon top layer is changed, then an electronics manufacturer may have to redevelop a significant number of processing steps and re-qualify the process to guarantee device reliability. This would represent significant development time and cost that could be avoided by keeping the thickness 140 that is within a well-characterized and qualified range that is suitable for existing processing protocols.

Figure 3A:
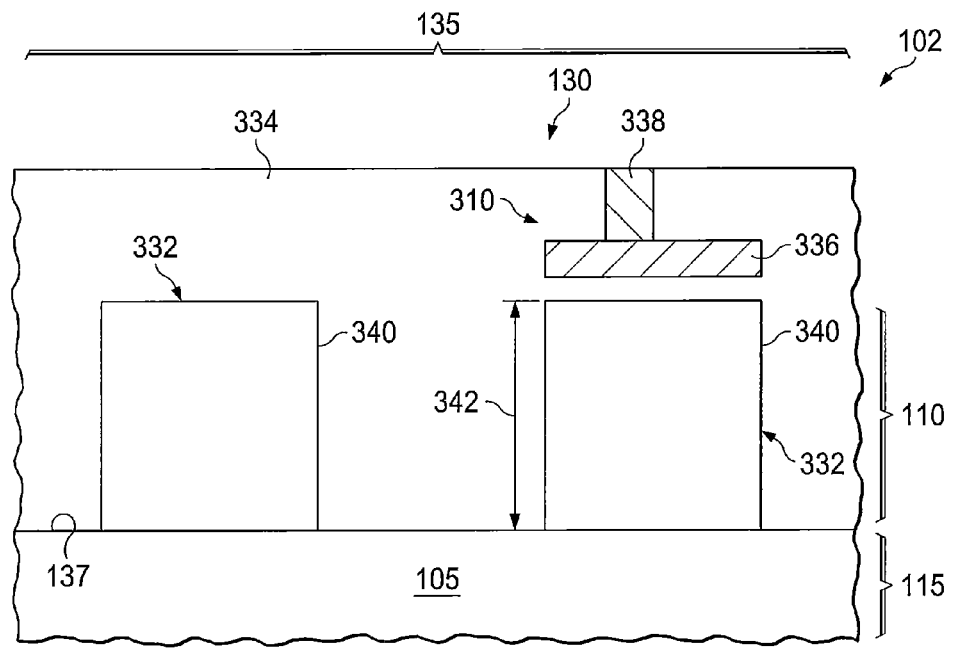
FIGS. 3A-3C show cross-sectional views of portions of a second lateral region of an electronic-photonic device, such as the device of FIG. 1.
Figure 3B:
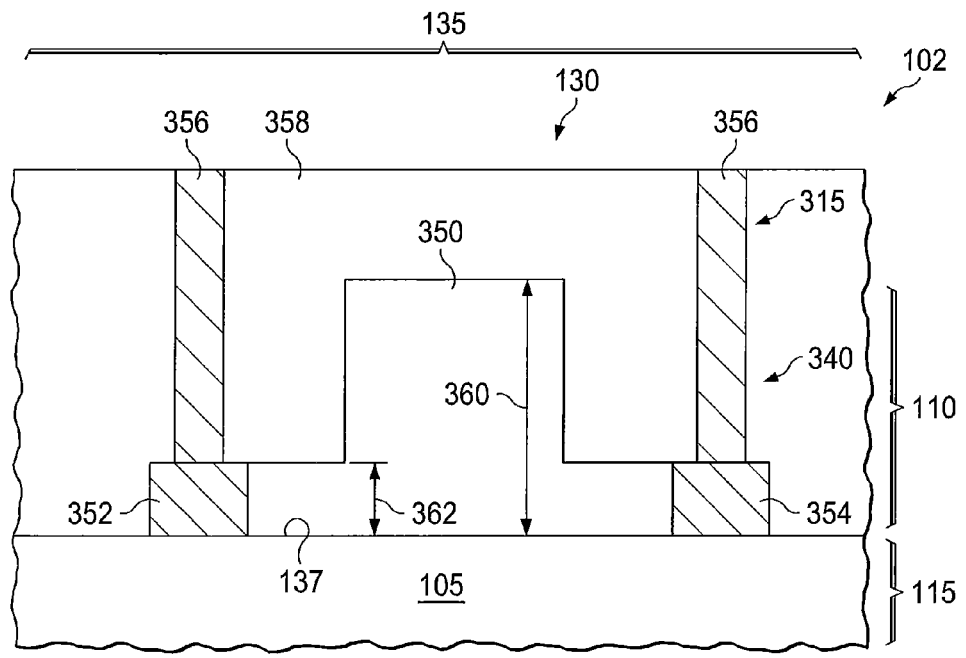
Figure 3C:
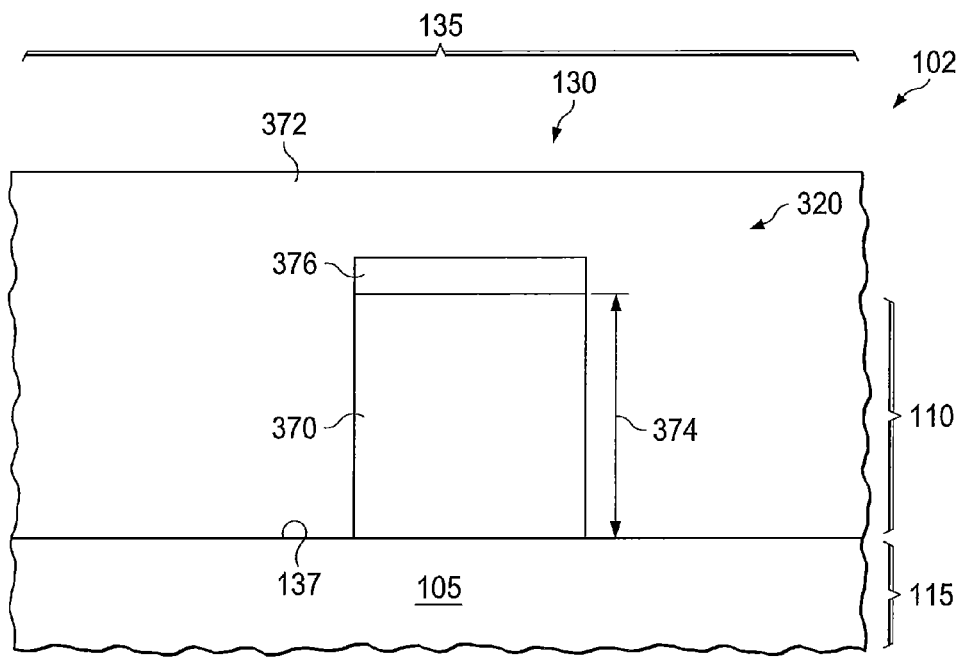

FIG. 3A-3C shows cross-sectional views of example portion of a second lateral region 135 of the electronic-photonic device 102. For example, the photonic waveguide components 130 can include one or more thermo-optic filters 310 (FIG. 3A), electro-optic modulators 315 (FIG. 3B) or photo-detectors 320 (FIG. 3C), all formed on the same SOI substrate 105 as the active electronic components 120 are formed on. Light-guiding portions of some or all of these components 310, 315, 320 can be formed from the silicon layer 110. As noted above, in some cases, the second-region thickness 145 can include a plurality of different thicknesses to facilitate individual optimal performance of each of several different types of photonic waveguide components 310, 315, 320.

For example, consider the thermo-optic filter 310 depicted in FIG. 3A, which can include waveguide cores 332 that are made from the top layer 110. The middle layer 115 and a material layer 334 can surround the waveguide core 332 and act together as a waveguide cladding. In some cases, the material layer 334 can be composed of silicon oxide, or, a polymer having a refractive index that is less than the index of the cores 332, and the middle layer 115 can be composed of silicon oxide. A resistive heating element 336 can be located near at least one of the two waveguide cores 332. Contacts 338 (e.g., Al or W contacts) can be located at ends (not shown) of the heating element 336 permit passing a current through the element 336 to thereby heat the element 336.

A signal light (not shown) can be split into two paths in the two waveguide cores 332 of the filter 310. The cores 332 can carry the light 338 along separate paths to a location where the light is then recombined (not shown). One skilled in the art would be familiar with how local heating one of the cores 332 by the heating element 336 can change the light's optical path length and how these changes can be used to filter specific frequencies of the recombined light.

Having cores 332 with a sufficiently large thickness facilitates light confinement in the core 332. For instance, light losses from the cores 332 due to roughness along side walls 340 of the core 332, are reduced for larger thickness cores as compared to thinner cores. For example, in some cases, a second-region thicknesses 342 of the thermo-optic cores 332 equals about 0.2 microns or greater. In some embodiments, the second-region thickness 342 is in a range of about 0.16 to 0.24 microns, and more preferably, about 0.24 microns.

As a second example, consider the electro-optic modulator 315 depicted in FIG. 3B. The modulator 315 can be configured as any of the embodiments disclosed in U.S. patent application Ser. No. 11/617,830 filed Dec. 29, 2006 to Gill (now published as U.S. 2008/0159680) and U.S. patent application Ser. No. 11/681,070 filed Mar. 1, 2007 to Gill et al., (now published as U.S. 2008/0212913), both incorporated by reference in their entirety.

For instance, the modulator 315 can include a ridge-shaped waveguide core 350 that is made from the top layer 110 (e.g., silicon layer). The core 350 can contact semiconductor slabs 352, 354. In the slabs 352, 354 can also be made from the top layer 110, although other semiconductor materials could be used, if desired. Interconnect structures 356 contacting the slabs 352, 354 can couple the modulator 315 to a voltage source (not shown). For example, the voltage source can be provided by active electronic components 120 located in a nearby first lateral region (FIG. 2). Similar to FIG. 3A, the middle layer 115 and another material layer 358, can surround the core 350 and slabs 352, 354 and together be configured as a waveguide cladding.

To contain light propagating through the ridge-shaped waveguide core 350, it is desirable for the electro-optic core 350 to have a second-region thickness 360 of about 0.15 microns or greater. For example, in some embodiments the second-region thickness 360 of the electro-optic waveguide core 350 is in a range from about 0.16 to 0.34 microns, more preferably, about 0.24 microns. As illustrated in FIG. 3A, in some cases the slabs 352, 354, which may not be used for light propagation, can have a smaller thickness 362, e.g., of about 0.1 microns or less in some cases.

Having an electro-optic waveguide core 350 of this thickness 360 range can also promote a faster response time of the modulator 315, because substantially all of the light propagating (e.g., at least about 90 percent) through the core 350 can be contained in a narrow volume of the core 350. Having more light confined within the narrow core 350 allows carriers (e.g., holes and electrons) to be swept away faster and more efficiently from the light path inside the core 360, e.g., when a reverse bias is applied to through the slabs 352, 354 to change the optical path length. Consequently, the path length of the modulator 315 can be more rapidly changed than for a thinner core (e.g., with a thickness of 0.1 microns or less).

Having an electro-optic waveguide core 350 in the above-recited range of thickness 360 can also help better confine light and thereby permit the use of a shorter length of electro-optic waveguide core 350. The length of the core 350 projects into and out of the page of the cross-sectional view shown in the FIG. 3B. For example in some cases, the length of the core 350 can be less than 0.6 cm. In comparison, if the analogous core 350 was 0.1 microns thick, a core length of about 2 cm or more may be needed to achieve the same degree of light optical path length modification.

As a third example, consider the photo-detector 320 depicted in FIG. 3C. The photo-detector can have a waveguide core 370 that is made from the silicon layer 110. Similar to that discussed in the context of FIGS. 3A and 3B, the middle layer 115 and another material layer 372, acting together as a waveguide cladding, can surround the core 370. In some embodiments, the second-region thickness 374 of the electro-photo-detector core 370 can be in a range from about 0.16 to 0.34 microns, more preferably about 0.24 microns. Such a thickness 374 is desirable because the overlap between the optical mode and the regions within the detector waveguide core that have been made to absorb light can be optimized. Also, the carrier path length from the core of the waveguide to the contact electrodes can be made smaller, and thereby have a faster response time.

In some embodiments the photo-detector 320 can further include a second material layer 376 on the core 370, or, in replacement of the silicon core. For example, the second material 376 can be a germanium layer on a silicon core 370. The second material layer 376 beneficially absorbs the light producing electronic carriers that can be collected to create an electronic signal. In such embodiments, the silicon core thickness 374 can be less than 0.2 microns, and more preferably in the range of about 0.05 to 0.2 microns, and even more preferably about 0.1 microns.

As noted above in the context of FIGS. 3A-3C, the second-region thickness 145 can include first, second and third thicknesses 342, 360, 374 for the thermo-optic filters 310, electro-optic modulators 315 and photo-detectors 320, respectively. Moreover, each of the first, second and third thicknesses 342, 360, 370 can be adjusted to the same or to different values to optimize the performance of these or other photonic waveguide components 130 of the apparatus 100. Moreover the thicknesses of individual components of the same type could be different. For example, photo-detector 320 containing a germanium layer 376, can have a waveguide core thickness 360 which is different than the waveguide core thickness 360 of a photo-detector 320 that does not have a germanium layer 376.

In some embodiments, there can be an abrupt change in the thickness 140, 145 of the top layer 110 from first lateral regions 125 to second lateral regions 135, thereby creating an uneven outer surface 137. In some embodiments, such as shown in FIG. 1, there can a gradual transition between the first-region thickness 140 and the second-region thickness 145. A gradual transition in thickness can facilitate forming better-defined first and second lateral regions 125, 135. Consider the case when the regions 125, 135 are formed from a top layer 110 via photolithography followed by etching or growing processes. In some cases, a photoresist layer (not shown) is deposited on the top layer 110 and then patterned to define the regions 125, 135 to be formed by subsequent etching or growth processes. Defining the regions 125, 135 can be problematic if the regions 125 135 have sharp transitions between them, and therefore the photoresist layer, may be adversely effected by abrupt changes in topology of the surface 137. For instance, a sharp height transition can degrade the uniformity of the photoresist thickness because of how the photoresist spreads out across the wafer when the resist is spun on, which can decrease the fidelity of pattern transfer. Having gradual transitions in the thickness of the top layer 110 makes it easier for the photoresist to achieve a more uniform thickness across the wafer, and thereby improve the fidelity of pattern transfer during photolithography that could cause inaccurate patterning.

In some cases, as illustrated in FIG. 1, there can be a transition region 150 between a first lateral region 125 and an adjacent second lateral region 135, the transition region 150 having a gradual increase in the thickness 152 of the top layer 110 (e.g., before etching layer 110 as indicated by the dotted lines) from the first lateral region 125 to the second lateral region 135. For instance, in some embodiments, the thickness 152 of the top layer 110 in the transition region 150 increases on average by about 0.01 microns per micron of a lateral distance 155 from the first lateral region 125 to the second lateral region 135. In still other embodiments, however, the outer surface 137 of the top layer 110 is substantially planar thereby avoiding photolithography problems associated with and uneven surface 137. Thus, abrupt differences in the vertical distance 157 of the surface 137 in the first lateral regions 125 versus the second lateral regions 135 can be minimized.

Separate photolithographic processes could be performed to define the regions 125, 135 whose surfaces are at different heights. This, however, could require the manufacture of separate masks for each of the regions 125, 135, resulting in additional costs for mask production and additional steps to manufacture the device 102.

As shown in FIG. 1, in some embodiments, the middle layer 115 has uniform thicknesses 160, 162 in both the first and second lateral regions 125, 135. For example, in some embodiments, the middle layer 115 has the same thicknesses 160, 162 in both the first and second lateral regions 125, 135. In other cases, the first-region middle thickness 160 is greater than the second-region middle thickness 162. In still other cases the first-region middle thickness 160 is less than the second-region middle thickness 162.

A second-region middle thickness 162 in the range of about 2 to 3 microns facilitates light containment because the middle region 115 serves as part of a waveguide cladding. Having a first-region middle thickness 160 in this range may not be desirable in some cases, however. For instance, when the middle layer 115 is composed of an insulator such as silicon oxide, heat dissipation from the active electronic components 120 may be inefficient, thereby causing the active electronic components 120 to operate at a higher-than-desired temperature, or necessitate a lesser component packing density. In some cases, to facilitate better heat dissipation of the active electronic components 120, the first-region middle thickness 160 is in a range of about 0.2 to 0.3 microns.

Figure 4:
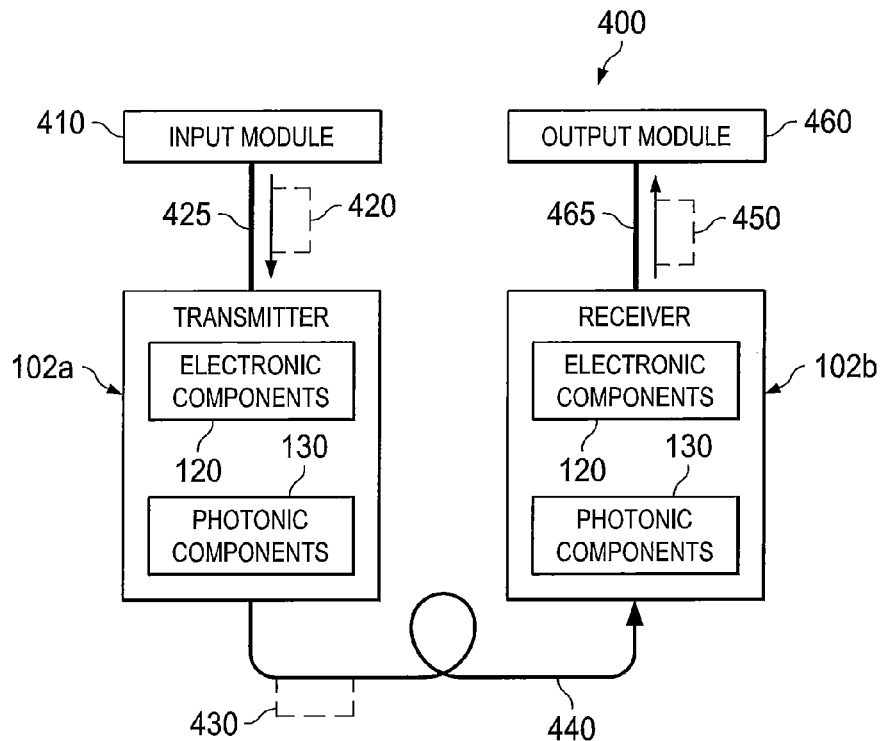
FIG. 4 shows a block diagram of an example embodiment of an apparatus of the disclosure that comprises an electronic-photonic device, such as the device of FIG. 1.

FIG. 4 shows a block diagram of an example apparatus 400 of the disclosure that comprises an embodiment of the above-described electronic-photonic device 102 (FIGS. 1-3C). In some cases, the electronic-photonic device 102 is part of, or is, a telecommunication transceiver, in the apparatus 400 configured as a telecommunications system. One of ordinary skill in the art would be familiar with how the electronic and photonic waveguide components 120, 130 of the device 102 could be configured to operate as a transceiver. For instance, the active electronic components 120 can include transistors or field-programmable arrays that are application specific integrated circuits adapted for use in a transceiver. The photonic waveguide components 130 can include thermo-optic filters, electro-optic modulators and photo-detectors that are coupled to each other and to the active electronic components 120. For example, at least some of said active electronic components can be electrically coupled to at least some of the photonic waveguide components such that the electronic-photonic device 102 is configured as a transceiver, e.g., in a telecommunications system 400. In some preferred embodiments, the electronic-photonic device 102 is configured to employ wavelength division multiplexing so that multiple information signals (e.g., in the form of different wavelengths of light) can be transmitted simultaneously through the device 102.

The apparatus 400 can further include an input module 410 that sends electronically-encoded-information signals 420 via a data bus 425 to at least one of the electronic-photonic devices 102a which is configured as a transmitter. The active electronic components 120 and photonic waveguide components 130 of the transmitter device 102a cooperate to convert the electronically-encoded-information signals 420 into optically-encoded-information signals 430 which are then transmitted through an optical transmission line 440 to another one of the electronic-photonic devices 102b which is configured as a receiver. The receiver device 102b converts the optically-encoded-information signal back into electronically-encoded-information signals 450 which are then transmitted to an output module 460 via a second data bus 465. One skilled in the art would be familiar with the variety of types of input module 410, optical transmission line 440, output module 460 and data buses 425, 465 that could be used in telecommunications systems 400. For example, the input module 410 can be an input/output matrix or a data multiplexer that aggregates a plurality of lower data rate electronic (or optical) signals into a single (or plurality) of higher data rate signals; where data grooming, format conversion, forward error correction, and/or signal pre-distortion can be implemented. The optical transmission line 440 can be an optical fiber cable, an optical backplane, an intra-chip, or inter-chip connection. The output module 460 can be a module that performs all or some of the functions outlined for above for the input module 410. One skilled in the art would appreciate that in some embodiments, the functions of the input and output modules 410, 460 could be incorporated into the electronic-photonic devices 102a, 102b, in which case, the modules 140, 460 depicted in FIG. 4 could correspond to arrays of fiber end connections that are housed in a rack with fibers coming therein.

Figure 5:
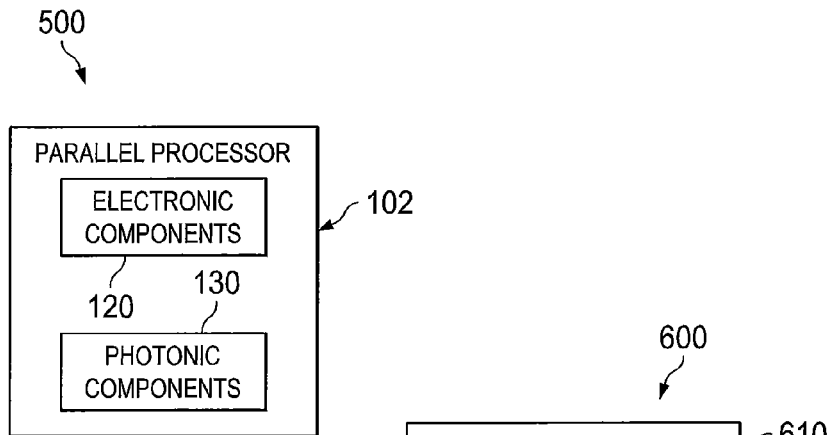
FIG. 5 shows a block diagram of a second example embodiment of an apparatus of the disclosure that comprises an electronic-photonic device, such as the device of FIG. 1.

FIG. 5 shows a block diagram of another example apparatus 500 of the disclosure that comprises an embodiment of the above-described electronic-photonic device 102. In some embodiments, the electronic-photonic device 102 is part of, or is, a parallel processor, in the apparatus 500 configured as a computer system. One skilled in the arts would understand how the electronic and photonic waveguide components 120, 130 of the device 102 could be configured to operate as a parallel processor. For instance, the electronics components 120 can include transistors that are used to perform parallel operations on electronically-encoded information that represent part of a computational problem. By dividing and working on different parts of the problem in parallel the problem can be solved faster than if an analogous computation was performed in serial. To achieve a meaningful result and optimize computation speed, however, the results of the parallel computations must be precisely recombined. The control and timing of this recombination is very important. The photonic waveguide components 130 can be configured to achieve recombination with very short latency times because optically-encoded information passed to electronically-encoded information can travel very rapidly through the photonic waveguide component 130 (e.g., near the speed of light) and can be recombined with the desired high precision. Also, the high speed optical signal can be transported much farther distances with less signal degradation than electronic signals, thereby easing system design constraints cause by issues like thermal management. Clock generation, recovery, and distribution functions could also be enabled in the optical domain to help manage and coordinate the electronic processes.

Another aspect of the present disclosure is a method of manufacturing an apparatus that comprises fabricating the electronic-photonic device. Any of the above-described embodiments of the electronic-photonic device could be manufactured by the method disclosed herein.

Figure 6:
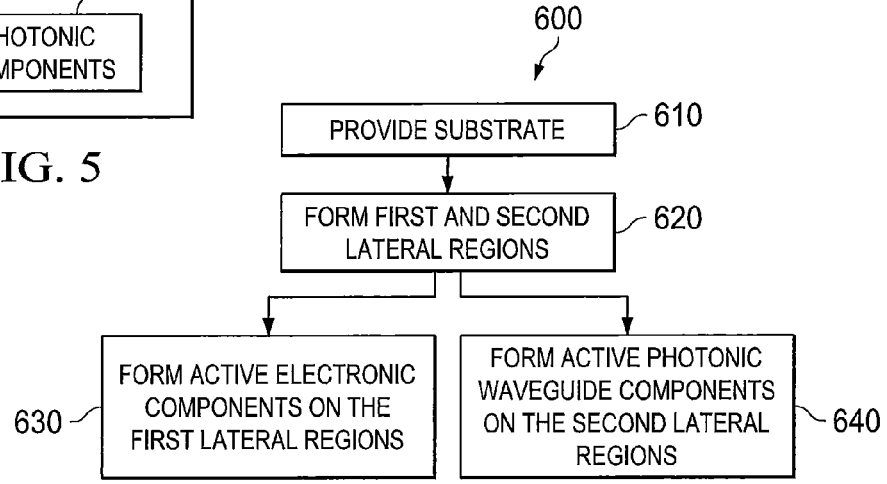
FIG. 6 presents a flow diagram of an example method of fabricating embodiments of the electronic-photonic devices of the disclosure, such as the device of FIG. 1.

FIG. 6 presents a flow diagram of an example method 600 of fabricating embodiments of the disclosed electronic-photonic device. The method 600 includes a step 610 of providing a planar substrate having a top layer on a middle layer, where the top layer has a higher refractive index than the middle layer. For example, in some cases, the substrate provided in step 610 is a silicon-on-insulator substrate, and, the top layer is a silicon layer located on a middle layer that is a silicon oxide layer.

The method 600 also includes a step 620 of forming first lateral regions and second lateral regions from the top layer such that a first-region region thickness of the first lateral region is less than a second-region thickness of the second lateral region. The method further includes a step 630 of forming active electronic components on the first lateral regions, and a step 640 and forming photonic waveguide components on the second lateral regions. One skilled in the art would be familiar with the various methods to form electronic and photonic waveguide components in accordance with steps 630 and 640.

FIGS. 7-20 present cross-sectional views of example embodiments of an electronic-photonic device 700 at selected stages of fabrication in accordance with steps 610 or 620 (FIG. 6). For clarity, analogous structures are identified using the same reference numbers as used in FIG. 1.

Figure 7:
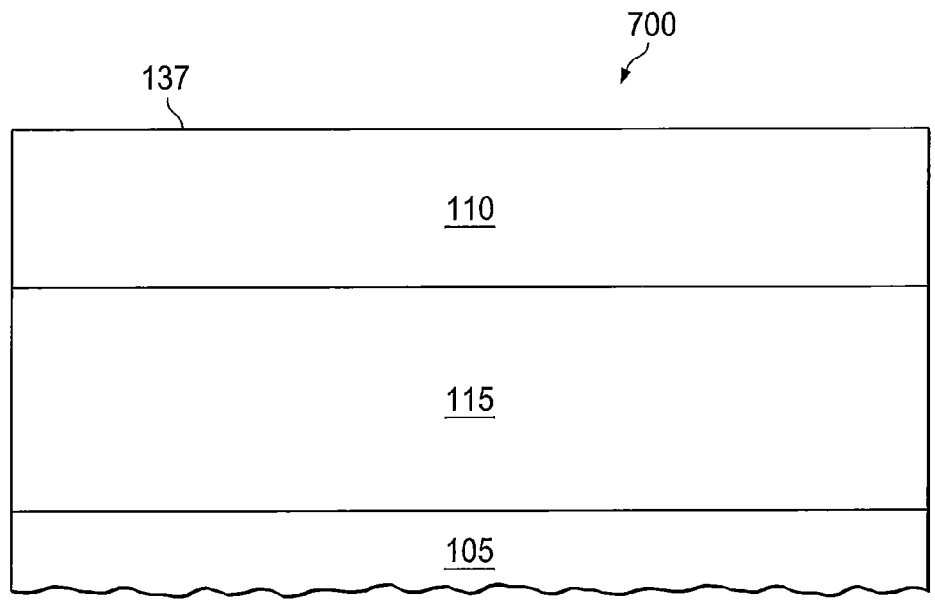
FIGS. 7-20 present cross-sectional views of example embodiments of electronic-photonic devices at selected stages of fabrication in accordance with certain steps in a method of manufacture, such as the method depicted in FIG. 6.

FIG. 7 shows the device 700 after providing a planar SOI substrate 105 having a silicon top layer 110 on a middle second layer 115, in accordance with step 610. In some embodiments, the silicon top layer 110 can have a thickness in a range of about 0.2 to 0.4 microns. In some cases, the middle layer 115 can be composed of silicon oxide. In some cases the middle layer 115 has a uniform thickness 160 in a range of about 2 to 3 microns.

Figure 8:
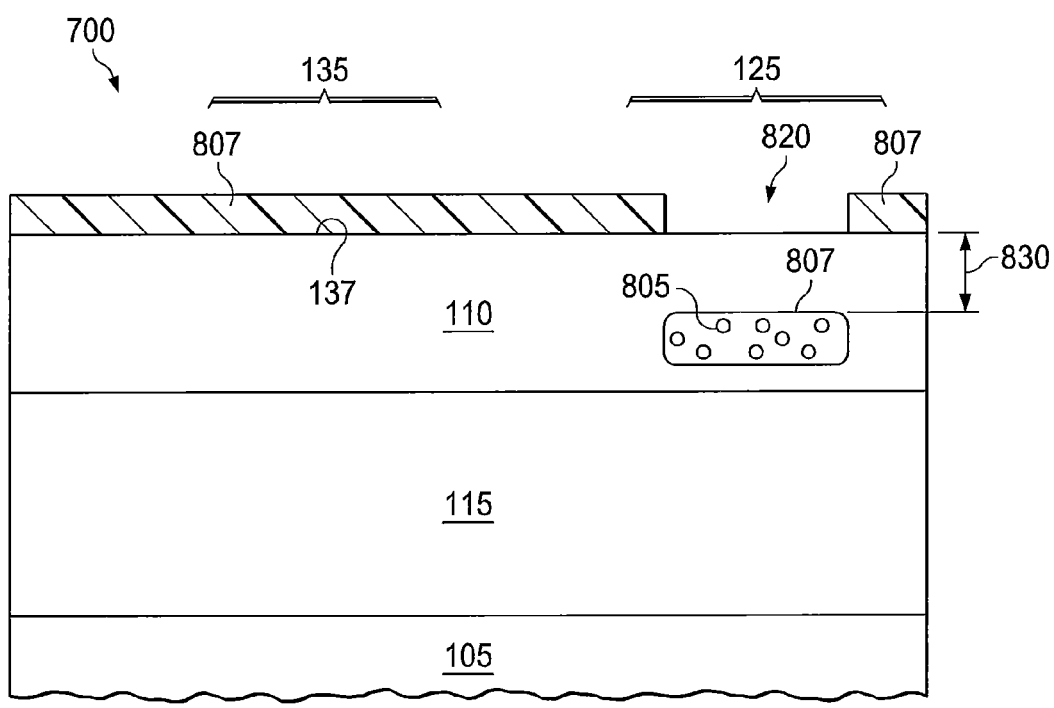
Figure 9:
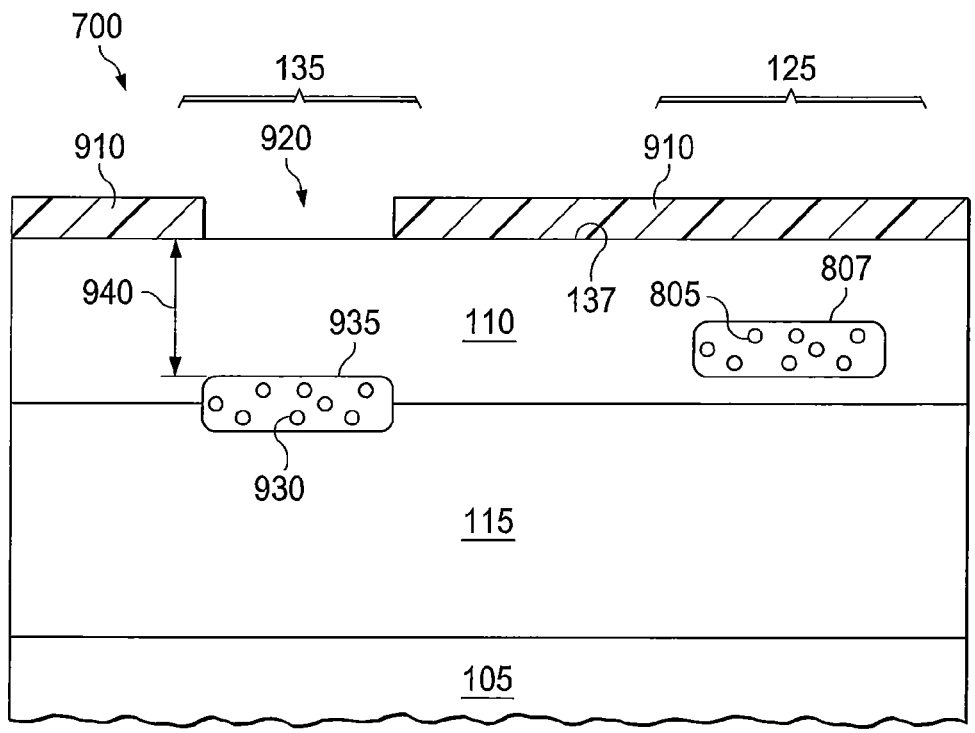
Figure 10:
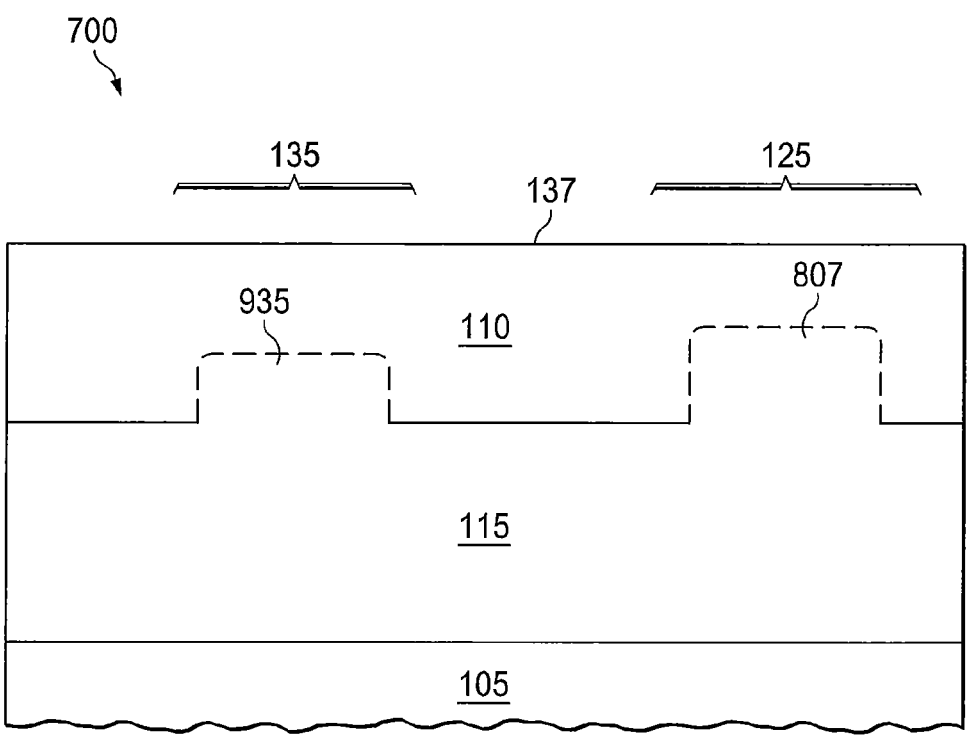

FIGS. 8-10 show selected stages in one embodiment of forming the first lateral regions 125 and second lateral regions 135 (step 620) by a first example process which includes oxygen atom implantation into the top layer 110. FIG. 8 shows the device 700 after selectively implanting oxygen atoms 805 into a first lateral region 125 of the top silicon layer 110 to form a first implanted region 807. To facilitate selective implantation, a mask layer 810 can be deposited on the top layer 110 and an opening 820 can be formed in the mask layer 810. For example, a photoresist mask layer 810 can be spin-coated on the top layer 110 and then the openings 820 can be formed by photolithography techniques. Similar processes could be used to form a mask layer 810 composed of other materials such as silicon nitride. The oxygen atoms 805 can then be implanted by a conventional ion implantation process through the openings 820. In some embodiments, for example, the oxygen atoms 805 are implanted to a depth 830 of at least about 0.1 microns into the top silicon layer 110 of the first lateral region 125 using ion implantation energies in the range of about 60 to 120 keV.

In some embodiments, no further oxygen implantations are done and a thermal anneal is performed as further discussed below in the context of FIG. 10. In such cases, the second-region thicknesses can be substantially the same as the original thickness 145 of the top layer 110.

In other cases, it may be desirable to further adjust the thicknesses of all or some of the second lateral regions 135. For example, as illustrated in FIG. 9, similar materials and methods as discussed in the context of FIG. 8 can be used to form a second mask layer 910 and openings 920 over one or more of the second lateral regions 135. A second selective implantation of oxygen atoms 930 can then be performed to form a second implanted region 935. The ion implantation energy can be adjusted to implant the oxygen atoms 930 at depth in the top layer 110 that is appropriate for selected photonic waveguide components 130. In some embodiments, for example, implantation energies in the range of about 100 to 200 keV can be used to implant the oxygen atoms 930 to a depth 940 of at least about 0.2 microns into the top silicon layer 110 of the second lateral region 135. In some embodiments, a plurality of implantation energies and doses can be used to create a more uniform oxygen ion distribution within the silicon.

FIG. 10 shows the device 700 of FIG. 8 or 9 after removing the mask layer (e.g., layer 810 or layer 910) and performing a thermal anneal as part of forming the first and second lateral regions 125, 135 in accordance with step 620. For example, in some embodiments, the thermal anneal comprises heating the top layer 110 to a temperature in the range from about 900 to 1100° C. for a duration in the range of about 1 to 60 minutes. As illustrated in some cases, the oxygen implanted regions 807, 935 can be substantially merged with the middle layer 115, and, have the same composition as the middle layer 115 (e.g., silicon oxide).

The implantation of oxygen atoms 805, 930 (FIGS. 8 and 9) can damage the top layer 110 enough to detrimentally affect the performance of the electronic or photonic waveguide components 120, 130 formed in the layer 110. For example, implanted portions of the top layer 110 can become substantially amorphous. To convert the amorphous regions of the top layer 110 back to a crystalline material, it is desirable to thermally anneal the top layer 110 after implantation. Additionally, the thermal anneal can facilitate a more uniform diffusion of the implanted oxygen atoms 805, 930 throughout the implanted regions 807, 935. The thermal anneal can also facilitate the interaction of the oxygen atoms with silicon of the top layer 110 to form the silicon oxide implanted regions 807, 935. As illustrated in FIG. 10, in some cases after annealing, one or both of the silicon oxide implanted regions 807, 935, can become merged with an underlying silicon oxide layer 110.

As already noted, there is some potential for photolithographic focusing problems due to the formation of an uneven surface 137 of FIG. 1. Implanting oxygen atoms 805, 930 below the surface 137, as illustrated in FIGS. 8-10, can mitigate the problem of an uneven surface because the top layer's surface 137 remains substantially planar after oxygen implantation and thermal anneal. For example in some embodiments after oxygen implantation and thermal anneal, the difference in vertical distance 157 of the surface 137 between the regions 125, 135 equals about 0.05 microns or less.

Figure 11:
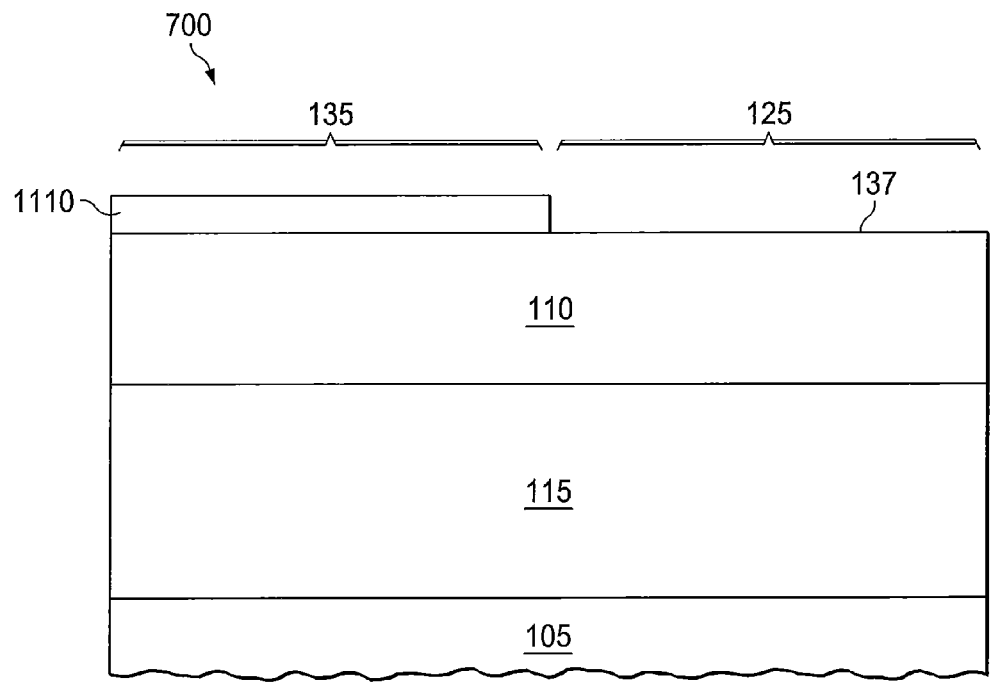
Figure 12:
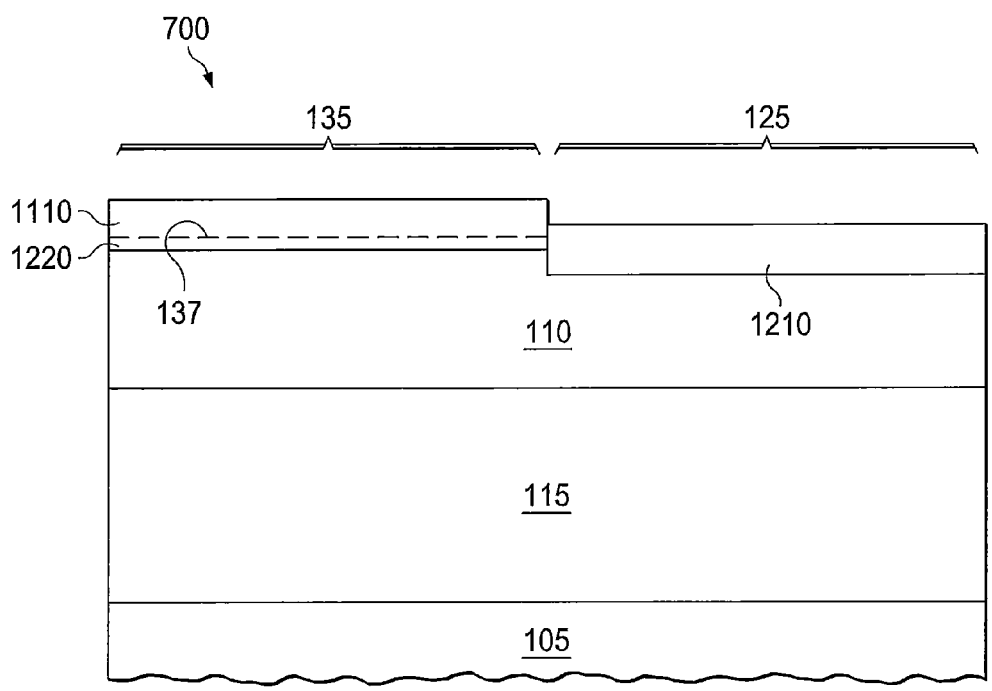
Figure 13:
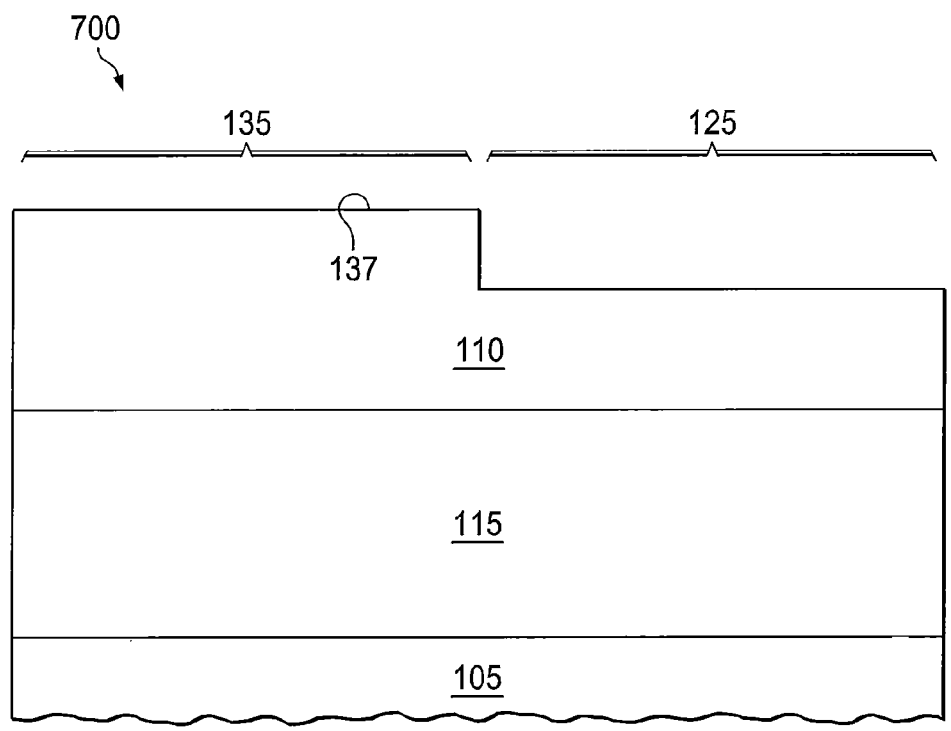

FIGS. 11-13 show selected stages in one embodiment of forming the first lateral regions and second lateral regions (step 620) by a second example process which includes forming an oxygen barrier layer and selectively removing a portion of the top layer in the first lateral regions, or, at least removing more of the top layer in the first lateral regions than in the second lateral regions.

FIG. 11 shows the device 700 depicted in FIG. 7 after forming oxygen barrier layers 1110 to cover the top silicon layer 110 corresponding to the second lateral regions 135. The barrier layers 1110 are made of a material (e.g., silicon nitride) that substantially impedes the diffusion of oxygen to top silicon layer in the second lateral regions 135. The barrier layers 1110 are formed so as to not cover the top silicon layer 110 corresponding to the first lateral regions 125. For example, in some embodiments, the oxygen barrier layers 1110 can be deposited on the top silicon layer 110 using conventional physical vapor deposition (PVD) or chemical vapor deposition (CVD) processes. Then, portions of the barrier layers 1110 that lay directly over the first lateral regions 125 can be removed using conventional photolithographic and etching processes such as reactive ion etching or wet etching.

FIG. 12 show the device 700 of FIG. 11 after oxidizing the uncovered portions of the top silicon layer 110 corresponding to the first lateral regions 125 to form silicon oxide layers 1210. For example, in some embodiments, the oxidation includes exposing the device 700 to an oxygen-containing atmosphere, temperature in a range from about 900 to 1100° C., and duration in a range of about 1 to 3600 minutes. As illustrated in FIG. 12, a portion of the silicon layer 110 in the first lateral region 125 is oxidized to form the silicon oxide layers 1210. As further illustrated in FIG. 12, in some cases a portion of the top silicon layer 110 in the second lateral regions 135 can also be oxidized to form silicon oxide layers 1220 because some oxygen can diffuse through the oxygen barrier layer 1110. In some embodiments, the formation of silicon oxide 1220 in the second lateral region 135 is substantially reduced, or eliminated altogether, by using a more oxygen impermeable barrier layer 1110 material such as silicon nitride.

FIG. 13 shows the device 102 of FIG. 12 after removing the barrier layers 1110 and the silicon oxide layers 1210 of the first lateral region 125, and in some cases, the silicon oxide layers 1220 of the second lateral regions 135. For example, in some cases, silicon oxide or silicon nitride barrier layers 1110 and silicon oxide layers 1210, 1220 can be removed by a wet etch process that includes exposing these layers 1110, 1210, 1220 to hydrofluoric acid. In other cases, a dry etch process such as reactive ion etching can be used to remove the layers 1110, 1210, 1220.

The second example process (FIGS. 11-13) has an advantage over the first example process (FIG. 8-10) in that the top silicon layer 110 that remains after the oxidation is not damaged by oxygen atom implantation. That is, the top silicon layer 110 can remain in its substantially pristine crystalline state and therefore does not need a thermal anneal to repair damaged regions created by oxygen atom implantation. On the other-hand, the first example process has the advantage providing a more planar top layer surface 137 than obtained using the second example process.

FIGS. 14-17 show selected stages in one embodiment of forming the first lateral regions and second lateral regions (step 620) by a third example process which includes oxidizing upper-most portions of the entire top layer, and then removing more of the top layer in the first lateral regions than in the second lateral regions.

Figure 14:
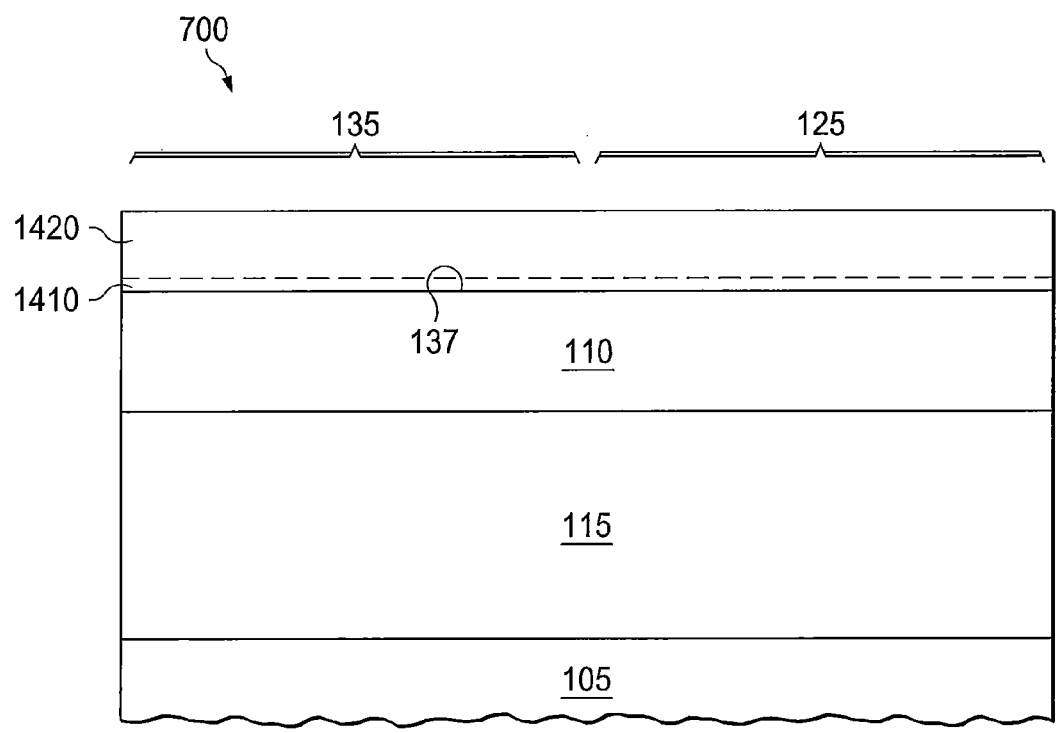

FIG. 14 shows the device 700 depicted in FIG. 7 after oxidizing an uppermost portion 1410 of the top silicon layer 110 in both of the first lateral regions 125 and said second lateral regions 135 to form a first silicon oxide layer 1420 on the top silicon layer 110. For example, oxidation can be performed under substantially the same conditions discussed in the context of FIG. 12.

Figure 15:
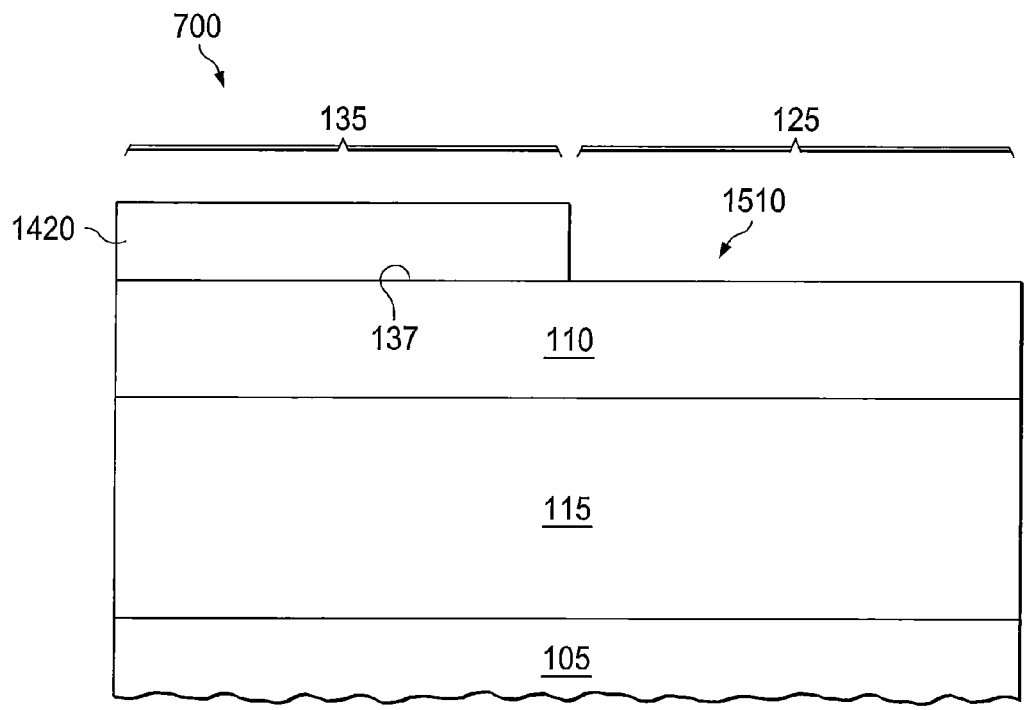

FIG. 15 shows the device of FIG. 14 after removing the first silicon oxide layer 1420 located directly over the first lateral region 125 to expose portions 1510 of the top silicon layer 110 there-under. For example, conventional photolithographic patterning and etching procedures analogous to that discussed in the context of FIG. 11 can be used to remove the silicon oxide layer 1420.

Figure 16:
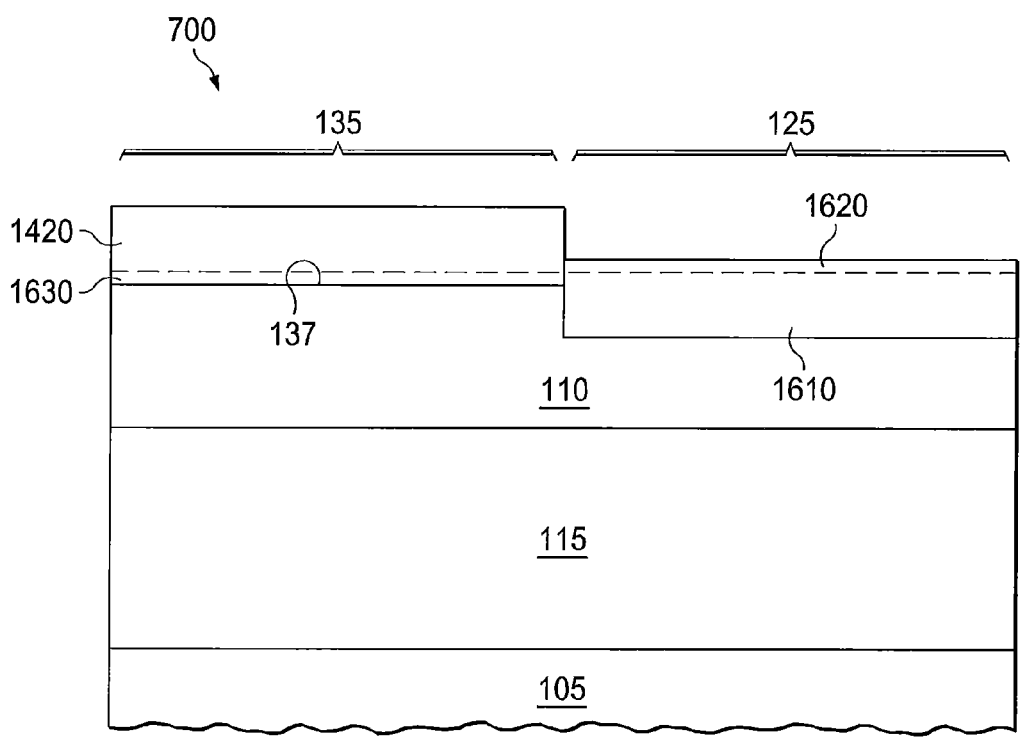

FIG. 16 shows the device of FIG. 15 after oxidizing a topmost part 1610 the exposed portions 1510 (FIG. 15) of the top silicon layer 110 to form a second silicon oxide layer 1620 in the first lateral region 125. Again, oxidation can be performed under substantially the same conditions as discussed in the context of FIG. 12. Also analogous to that discussed in the context of FIG. 12, some of the top silicon layer 110 in the second lateral region 135 can also get oxidized to form a second-region 135 second silicon oxide layer 1630.

Figure 17:
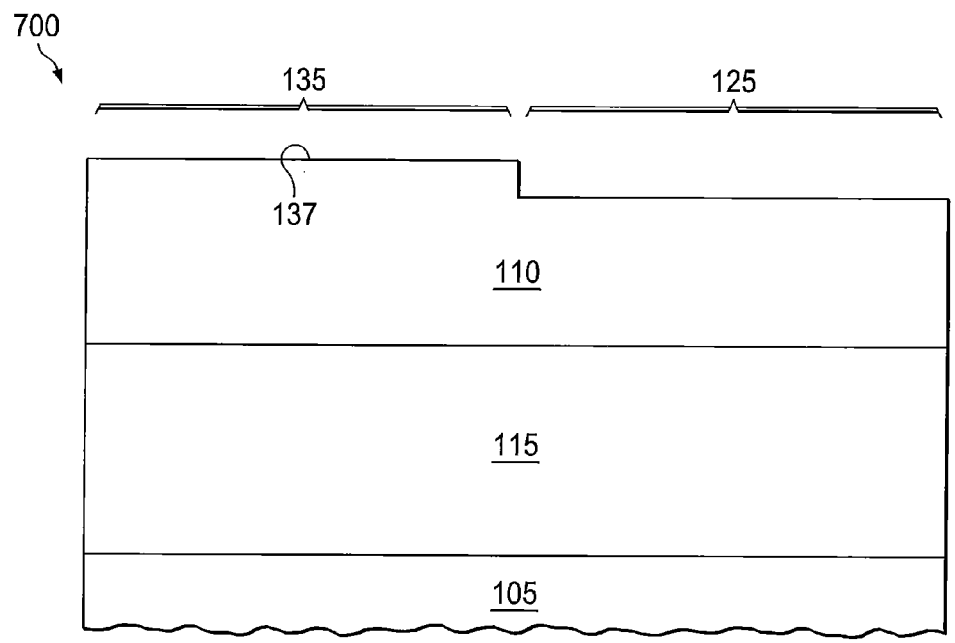

FIG. 17 shows the device of FIG. 16 after removing the first oxide layers 1420 and second silicon oxide layers 1620, 1630. For example, the same wet or dry etch process discussed above in the context of FIG. 13 can be used to remove these oxide layers 1420, 1620, 1630.

Similar to the second process, the third example process can advantageously leave remaining portions of the top silicon layer 110 in its pristine state. Unlike the second process, the third process also does not require the deposition and patterning of a barrier layer. Similar to the second process, however, the top silicon layer 110 resulting from the third process can have an uneven surface 137, which in turn, could cause inaccurate patterning of the first and second lateral regions 125, 135.

Figure 18:
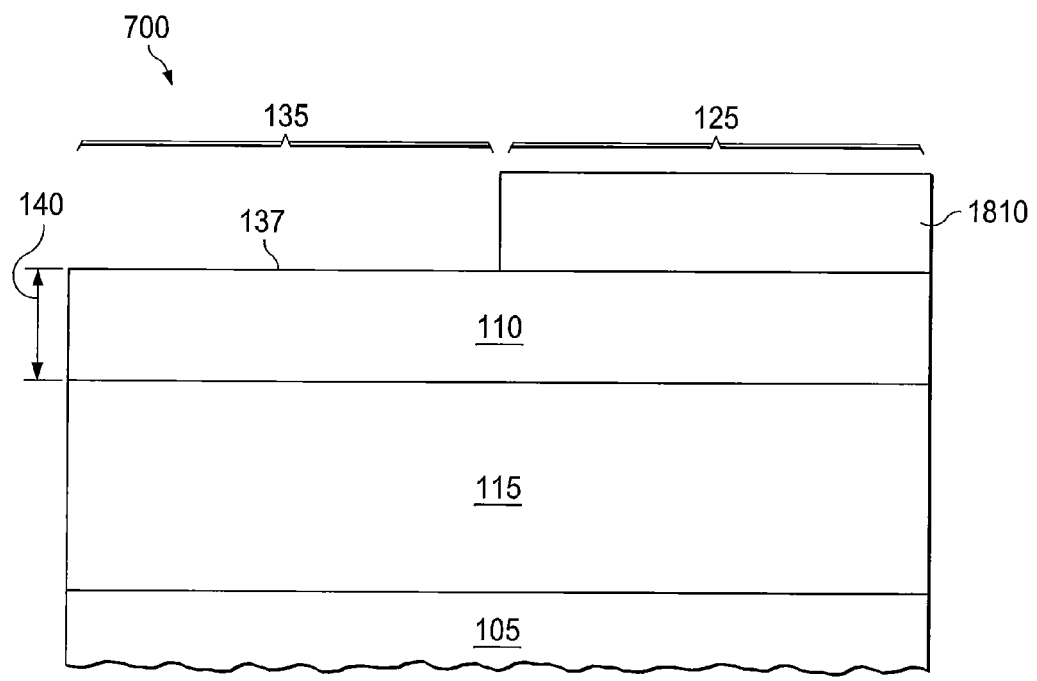
Figure 19:
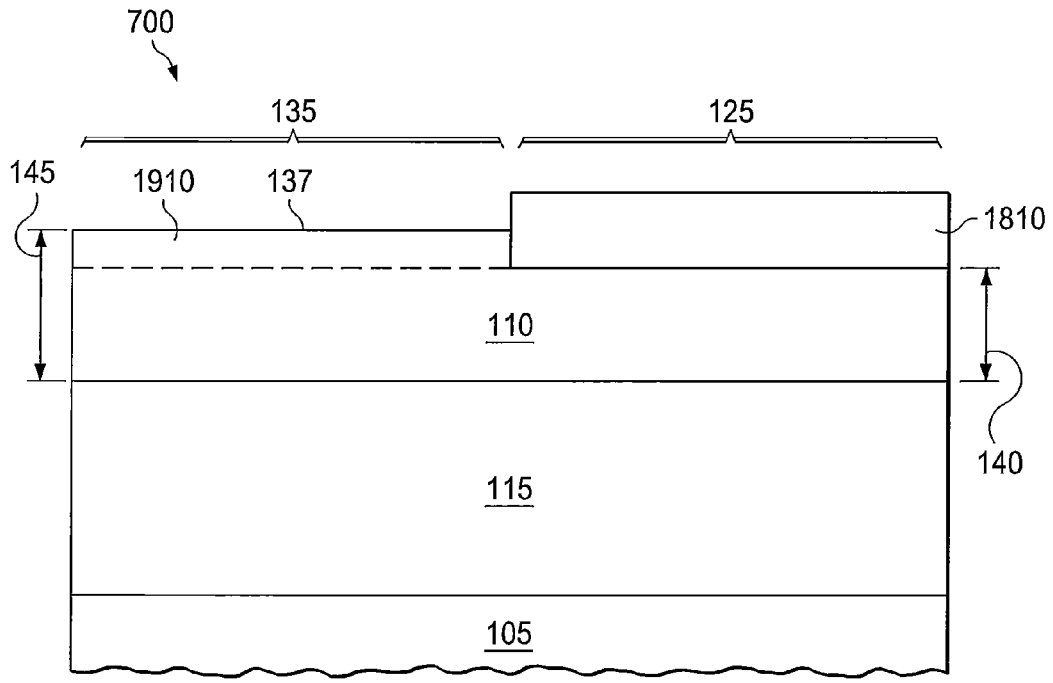
Figure 20:
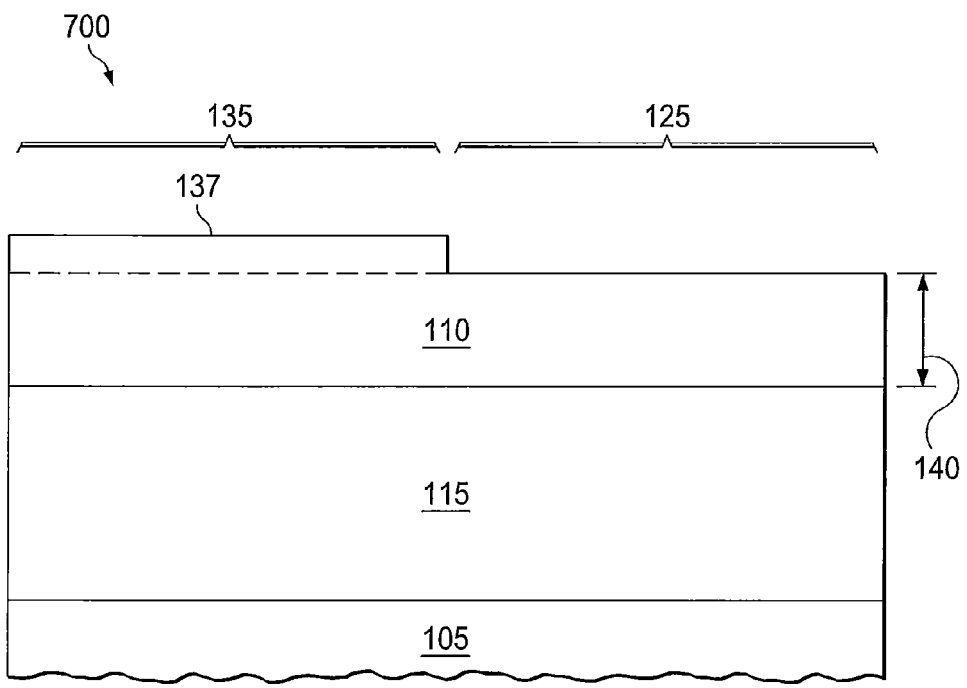

FIGS. 18-20 show selected stages in one embodiment of forming the first lateral regions and second lateral regions (step 620) by a fourth example process which includes the selective growth of silicon on the top layer of the second lateral region.

FIG. 18 shows the device 700 depicted in FIG. 7 after covering the first lateral region 125 with a material layer 1810. In some embodiments, the silicon top layer 110 can have a thickness 140 in a range of about 0.05 to 0.15 microns. The same materials and processes described in the context of FIG. 11 can be used to selectively form a silicon oxide or silicon nitride material layer 1810 such that it covers the first lateral region but does not cover the second lateral region 135. Or, photolithographic processes similar to that discussed in the context of FIG. 8 can be used to form a photoresist material layer 1810 such that it selectively covers the first lateral region 125 but not the second lateral region 135.

FIG. 19 shows the device 700 of FIG. 18 after selectively growing a silicon layer 1910 on the second lateral region 135. For example, a crystalline silicon layer 1910 can be grown on the second lateral region 135 a chemical vapor deposition process. In some cases, growing the silicon layer 1910 further includes incorporating dopants (not shown) into the silicon layer 1910. The incorporation of dopants can be desirable because dopants can facilitate the modification of carrier distributions within a given photonic or electronic device using applied electric fields, thereby allowing processing of signals in the optical or electronic domain.

As illustrated in FIG. 19 the grown silicon layer 1910 can be merged with the top silicon layer 110 and consequently the thickness 145 of the silicon layer 110, 1910 in the second lateral region 135 is greater than the thickness 140 of the silicon layer 110 in the first lateral region 125.

FIG. 20 shows the device 700 of FIG. 19 after removing the material layer 1810 (FIG. 19). For example, the same wet or dry etch process discussed above in the context of FIG. 13 can be used to remove the material layer.

One skilled in the art would be familiar with how the devices 700 at the stages depicted in FIG. 10, 13, 17 or 20, could be further processed using conventional procedures to form electronic and photonic waveguide components on the first and second lateral regions 125, 135, in accordance with steps 630 and 640, respectively. For example, forming the active electronic components 120 can include form MOS transistors devices 205 (FIG. 2). The hole or electron carrier structures of the transistors 205 can be located in portions of the top silicon layer 110 in the first lateral regions 125. Example carrier structures include doped wells 210, source and drain structures 220 and channel regions 230 formed from portions of the top silicon layer 110 (FIG. 2) in the second lateral regions 135. For example, forming the photonic waveguide components 130 can include forming light-guiding structures from the top silicon layer 110 in the second lateral region 135. Example light-guiding structures include waveguide cores 332 of thermo-optic filters 310, waveguide cores 350 of electro-optic modulators 315 or waveguide cores 370 of photo-detectors 320 (FIG. 3A-3C). For instance, forming the electronic and photonic waveguide components 120, 130 can include electrically coupling at least one of the photonic waveguide components 130 to at least one of the active electronic components 120 so as to configure the electronic-photonic device 700 as a transceiver in an apparatus configured as a telecommunications system.

Although the embodiments have been described in detail, those of ordinary skill in the art should understand that they could make various changes, substitutions and alterations herein without departing from the scope of the disclosure.

What is claimed is:

1. A method for manufacturing an apparatus, comprising:
   fabricating an electronic-photonic device, including:
   providing a planar substrate having a top layer on a middle layer, wherein said top layer has a higher refractive index than said middle layer;
   forming first lateral regions and second lateral regions from said top layer such that a first-region thickness of said first lateral regions is less than a second region-thickness of said second lateral regions;
   forming active electronic components on said first lateral regions; and
   forming active photonic waveguide components on said second lateral regions, and wherein one or more of said active electronic components include said top layer as a structural component.

2. The method of claim 1, wherein said substrate includes a silicon-on-insulator substrate, and, said top layer is a silicon layer located on said middle layer that is a silicon oxide layer.

3. The method of claim 1, wherein forming said active electronic components includes forming MOS transistors, wherein carrier structures of said transistors are located in said first lateral region.

4. The method of claim 1, wherein forming said active photonic waveguide components includes forming light-guiding structures in said second lateral region.

5. The method of claim 1, wherein said electronic-photonic device is part of a telecommunication transceiver in said apparatus configured as a telecommunications system.

6. A method for manufacturing an apparatus, comprising:
   fabricating an electronic-photonic device, including:
   providing a planar substrate having a top layer on a middle layer, wherein said top layer has a higher refractive index than said middle layer;
   forming first lateral regions and second lateral regions from said top layer such that a first-region thickness of said first lateral regions is less than a second region-thickness of said second lateral regions;
   forming active electronic components on said first lateral regions; and
   forming active photonic waveguide components on said second lateral regions, and wherein said substrate includes a silicon-on-insulator substrate, and, said top layer is a silicon layer located on said middle layer that is a silicon oxide layer, and wherein forming said first lateral regions and said second lateral regions includes:
   covering said first lateral region with a material layer;
   selectively growing a silicon layer on said second lateral region; and
   removing said material layer.

7. A method for manufacturing an apparatus, comprising:
   fabricating an electronic-photonic device, including:
   providing a planar substrate having a top layer on a middle layer, wherein said top layer has a higher refractive index than said middle layer;
   forming first lateral regions and second lateral regions from said top layer such that a first-region thickness of said first lateral regions is less than a second region-thickness of said second lateral regions;
   forming active electronic components on said first lateral regions; and
   forming active photonic waveguide components on said second lateral regions, and wherein said substrate includes a silicon-on-insulator substrate, and, said top layer is a silicon layer located on said middle layer that is a silicon oxide layer, and wherein forming said first lateral regions and said second lateral regions includes:
   selectively implanting oxygen atoms into said first lateral region of said top silicon layer; and
   thermally annealing said top silicon layer to form an implanted silicon oxide region in said top silicon layer.

8. A method for manufacturing an apparatus, comprising:
   fabricating an electronic-photonic device, including:
   providing a planar substrate having a top layer on a middle layer, wherein said top layer has a higher refractive index than said middle layer;
   forming first lateral regions and second lateral regions from said top layer such that a first-region thickness of said first lateral regions is less than a second region-thickness of said second lateral regions;
   forming active electronic components on said first lateral regions; and
   forming active photonic waveguide components on said second lateral regions, and wherein said substrate includes a silicon-on-insulator substrate, and, said top layer is a silicon layer located on said middle layer that is a silicon oxide layer, and wherein forming said first lateral regions and said second lateral regions includes:
   forming oxygen barrier layers to cover said top silicon layer corresponding to said second lateral regions;
   oxidizing an uncovered portion of said top silicon layer corresponding to said first lateral regions to form silicon oxide layers; and
   removing said barrier layer and said silicon oxide layer.

9. A method for manufacturing an apparatus, comprising:
   fabricating an electronic-photonic device, including:
   providing a planar substrate having a top layer on a middle layer, wherein said top layer has a higher refractive index than said middle layer;
   forming first lateral regions and second lateral regions from said top layer such that a first-region thickness of said first lateral regions is less than a second region-thickness of said second lateral regions;
   forming active electronic components on said first lateral regions; and
   forming active photonic waveguide components on said second lateral regions, and wherein said at least some of said active electronic components are electrically coupled to at least some of said active photonic waveguide components.

10. A method for manufacturing an apparatus, comprising: fabricating an electronic-photonic device, including:
providing a planar substrate having a top layer on a middle layer, wherein said top layer has a higher refractive index than said middle layer;
forming first lateral regions and second lateral regions from said top layer such that a first-region thickness of said first lateral regions is less than a second region-thickness of said second lateral regions;
forming active electronic components on said first lateral regions; and
forming active photonic waveguide components on said second lateral regions, and wherein said substrate includes a silicon-on-insulator substrate, and, said top layer is a silicon layer located on said middle layer that is a silicon oxide layer, and wherein forming said first lateral regions and said second lateral regions includes:
oxidizing an uppermost portion of said top silicon layer in both of said first lateral regions and said second lateral regions to form a first silicon oxide layer on said silicon layer;
removing said first silicon oxide layer located directly over said first lateral regions to expose portions of said top silicon layer there-under;
oxidizing a topmost part of said exposed portions to form a second silicon oxide layer; and
removing said first and second silicon oxide layers.

11. A method for manufacturing an apparatus, comprising: fabricating an electronic-photonic device, including:
providing a planar substrate having a top layer on a middle layer, wherein said top layer has a higher refractive index than said middle layer;
forming first lateral regions and second lateral regions from said top layer such that a first-region thickness of said first lateral regions is less than a second region-thickness of said second lateral regions;
forming active electronic components on said first lateral regions; and
forming active photonic waveguide components on said second lateral regions, and wherein said top layer includes one or more of a well region, source region, drain region or channel region of said active electronic components.

12. A method for manufacturing an apparatus, comprising: fabricating an electronic-photonic device, including:
providing a planar substrate having a top layer on a middle layer, wherein said top layer has a higher refractive index than said middle layer;
forming first lateral regions and second lateral regions from said top layer such that a first-region thickness of said first lateral regions is less than a second region-thickness of said second lateral regions;
forming active electronic components on said first lateral regions; and
forming active photonic waveguide components on said second lateral regions, and further including a transition region between said first-region thickness and said second-region thickness, wherein said transition region has a gradual increase in thickness from said first lateral region to said second lateral region.

* * * * *